United States Patent
Singh et al.

(10) Patent No.: US 10,177,161 B2
(45) Date of Patent: Jan. 8, 2019

(54) METHODS OF FORMING PACKAGE STRUCTURES FOR ENHANCED MEMORY CAPACITY AND STRUCTURES FORMED THEREBY

(71) Applicant: Intel Corporation, Santa Clara, CA (US)

(72) Inventors: Navneet K. Singh, Bangalore (IN); Shanto A. Thomas, Bangalore (IN); Ranjul Balakrishnan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/392,006

(22) Filed: Dec. 28, 2016

(65) Prior Publication Data
US 2018/0182734 A1   Jun. 28, 2018

(51) Int. Cl.
*H01L 21/332* (2006.01)
*H01L 29/66* (2006.01)
*H01L 27/11512* (2017.01)
*H01L 27/108* (2006.01)

(52) U.S. Cl.
CPC .. *H01L 27/11512* (2013.01); *H01L 27/10897* (2013.01); *H01L 2224/16225* (2013.01)

(58) Field of Classification Search
CPC ............... H01L 27/11512; H01L 27/108947
USPC .......................................... 257/341; 438/140
See application file for complete search history.

(56) References Cited

U.S. PATENT DOCUMENTS

| | | | |
|---|---|---|---|
| 6,907,198 B2* | 6/2005 | Nishimura | G02B 6/12007 385/14 |
| 9,431,374 B2* | 8/2016 | Lee | H01L 23/49838 |
| 2004/0099938 A1 | 5/2004 | Kang et al. | |
| 2014/0159248 A1 | 6/2014 | Mohammed et al. | |
| 2014/0321804 A1 | 10/2014 | Thacker et al. | |
| 2015/0221614 A1 | 8/2015 | Sutardja | |
| 2016/0190109 A1 | 6/2016 | Lee et al. | |

FOREIGN PATENT DOCUMENTS

KR   10-2015-0094655   8/2015

OTHER PUBLICATIONS

International Search Report and Written Opinion for International Patent Application No. PCT/US17/61733, dated Mar. 5, 2018.

* cited by examiner

*Primary Examiner* — Calvin Lee
(74) *Attorney, Agent, or Firm* — Green, Howard & Mughal LLP

(57) ABSTRACT

Methods of forming microelectronic package structures, and structures formed thereby, are described. Those methods/structures may include attaching a die on a board, attaching a substrate on the die, wherein the substrate comprises a first region and a peripheral region, attaching a first memory device on the central region of the substrate, and attaching at least one additional memory device on the peripheral region of the substrate, wherein the at least one additional memory device is not disposed over the die.

17 Claims, 7 Drawing Sheets

METHODS OF FORMING PACKAGE STRUCTURES FOR ENHANCED MEMORY CAPACITY AND STRUCTURES FORMED THEREBY

BACKGROUND

Various microelectronic package substrates, such as package on package (PoP) substrates, may be employed in the fabrication of computing devices, such as in the fabrication of mobile phones and tablets, for example. Such computing devices can benefit from having a greater memory capacity available for higher performance.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
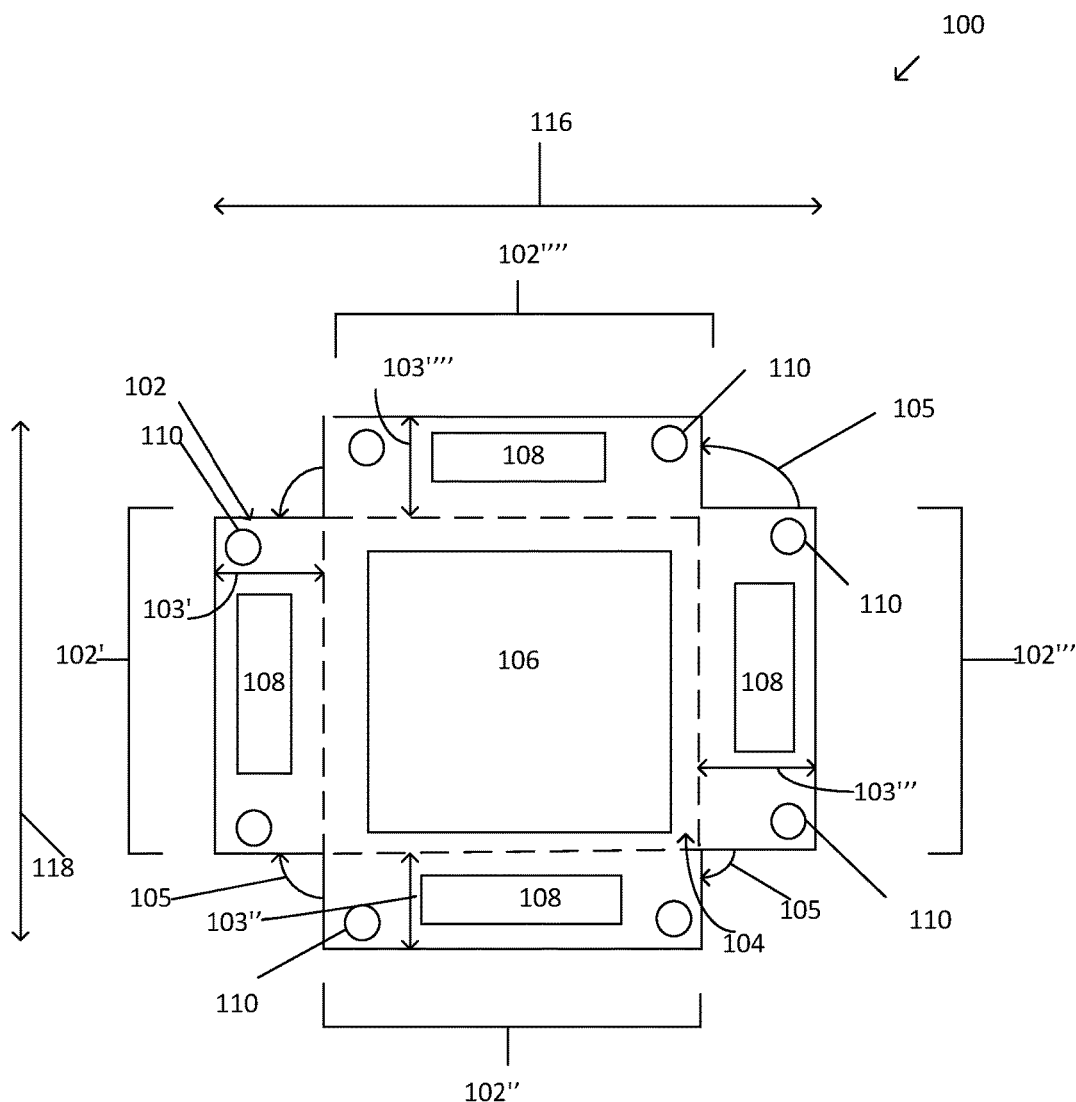
FIGS. 1a-1b represent top views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprises an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with a substrate by a number of interconnects in a flip-chip arrangement. However, in other embodiments, alternative structures and/or methods may be utilized to couple a die with a substrate.

Embodiments of methods of forming packaging structures, such as methods of forming microelectronic substrate structures to increase memory capacity for computing devices, are described. Those methods/structures may include attaching a die on a board, attaching a substrate on the die, wherein the substrate comprises a first region and a peripheral region, attaching a first memory device on the central region of the substrate, and attaching at least one additional memory device on the peripheral region of the substrate, wherein the at least one additional memory device is not disposed over the die. The embodiments herein enable the realization of greater memory capacity for computing devices, while conserving board real estate.

Figure 1B:
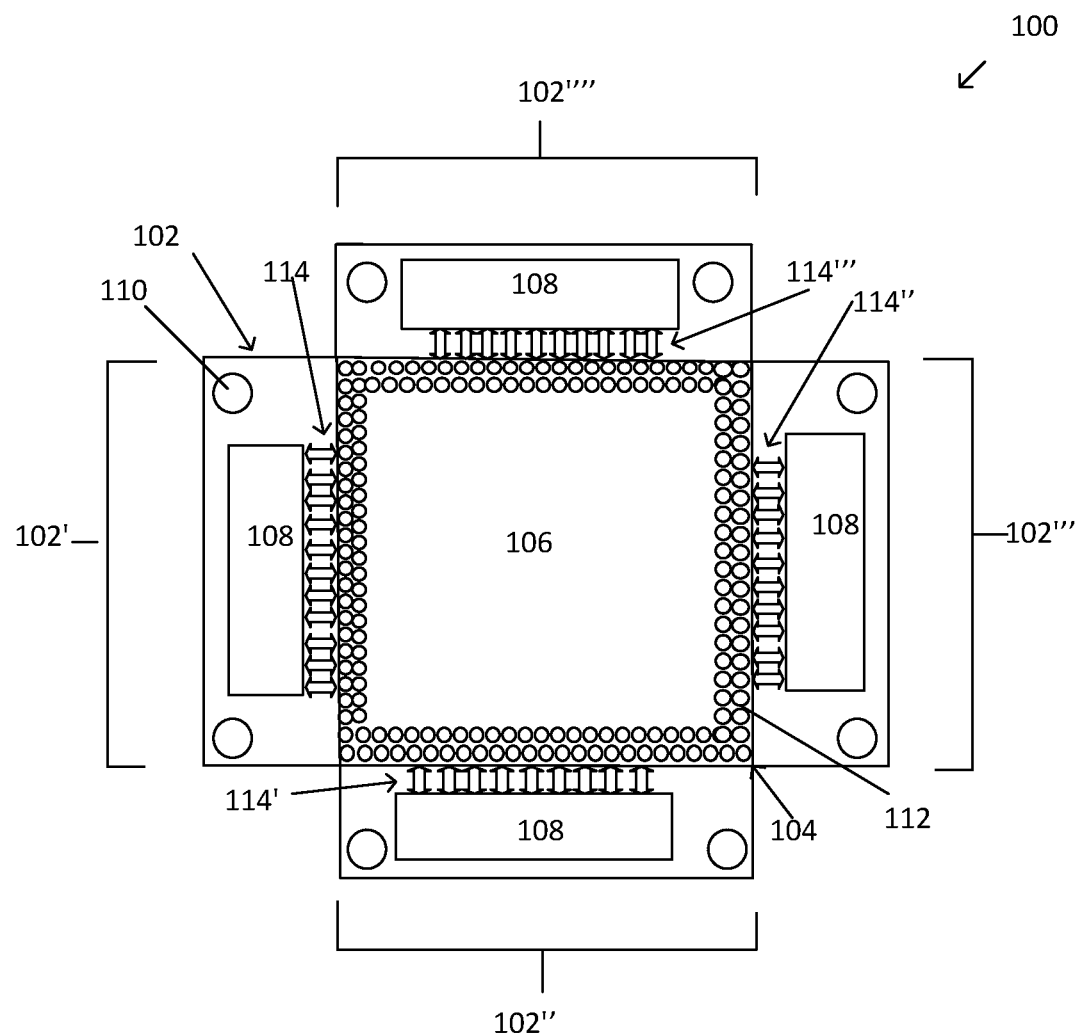

FIGS. 1a-1b illustrate top views of embodiments of fabricating package structures that increases memory capacity for microelectronic devices, such as computing devices. In FIG. 1a (top view), a portion of a substrate 100, such as an interposer and/or a package substrate 100, for example, is shown. In an embodiment, the substrate 100, may comprise a board such as a fiberglass reinforced epoxy laminated board that is flame retardant (FR4), for example. In another embodiment, the package substrate 100 may comprise a portion of a printed circuit board (PCB board), for example, and in other embodiments, the substrate 100 may comprise any suitable materials according to the particular application.

In an embodiment, the substrate 100 may comprise a first portion/region 102, and a second portion/region 104. In an embodiment, the first portion 102 may comprise at least one peripheral/terminal portion (for example, peripheral portions 102', 102", 102"' and 102""), located adjacent to the second portion 104, wherein the second portion 104 may comprise a centrally located portion of the substrate 100. In an embodiment, the second portion 104 may comprise a rectangular shape, but may comprise other shapes in other embodiments. In an embodiment, the first portion 102 may comprise four peripheral portions 102', 102", 102"', 102"" each separated from each other by a gap 105. The gap 105 may comprise an angle in an embodiment, wherein the angle of the gap 105 may comprise between about 30 degrees and about 120 degrees, in an embodiment.

In an embodiment the four peripheral portions 102', 102", 102"', 102"" may comprise rectangular shapes, but in other embodiments they may comprise other shapes, such as triangles, circles, etc. depending upon the application. In an embodiment, the substrate 100 may comprise a thin, small PCB, and may comprise a portion of a POP package. In an embodiment, the peripheral sections 102', 102", 102"', 102"" of the substrate 100 may comprise a width 103, which may vary according to the particular application design.

In an embodiment, the second portion 104 of the substrate 100 may comprise a rectangular shape, and may be in direct physical contact with each of the peripheral portions 102', 102" 102"', 102"" of the first portion 102. In an embodiment, the second portion 104 may comprise a central portion of the substrate 100. The second portion 104 may comprise a first memory device 106 disposed on a surface of the interposer 100, in an embodiment. In an embodiment, the first memory device 106 may comprise a 4 GB memory device, and may comprise a quad die package (QDP) memory device. In an embodiment, the first memory device 106 may comprise a 4 GB (x64 QDP) memory device. In other embodiments, the first memory device 106 may comprise any suitable type of memory device, depending upon the particular application.

In another embodiment, each of the first portions 102', 102" 102"', 102"" of the substrate 100 may comprise an additional memory device 108 disposed thereon, wherein the additional memory device(s) 108 may comprise a 1 GB memory device, for example. In an embodiment, each of the 1 GB additional memory devices disposed on each of the first portions 102', 102", 102"', 102"" may comprise x16 1 GB. In an embodiment, at least one of the first memory device 106 or at least one of the additional memory devices 108 may comprise a low power dynamic data rate (LPDDR4) synchronous dynamic random access memory (DRAM) memory device. In an embodiment, the LPDDR4 memory device(s) of the embodiments herein may operate according to a JESD209-4 LPDDR4 Low Power Dual Data Rate Memory Device Standard. In an embodiment, the substrate 100 may comprise a total of 8 GB LPDDR4 memory capacity.

In an embodiment, the additional memory devices 108 may comprise standard memory devices, and the first memory device 106 may be a larger size than the additional memory devices 108. In an embodiment the additional memory devices 108 may be attached to the substrate 100 along the boundaries/terminal portions of the substrate 100 and the larger first memory device 106 may be soldered onto the substrate 100. In an embodiment, a top surface of the first memory device 106 may comprise an area (length times width) that is more than about twice the magnitude of an area of an individual additional memory device 108.

In an embodiment, the individual first sections 102', 102", 102"', 102"" of the interposer 100 may comprise openings 110 in corner locations of each of the first sections 102', 102", 102"', 102"" 102, in an embodiment, wherein the openings 110 may function to fix/attach the substrate 100 onto a lower substrate, such as onto a motherboard, for example. In an embodiment, the substrate 100 may comprise a length 116 and a width 118. In an embodiment, the length 116 and width dimensions 118 may comprise about 32 mm by 32 mm, however the length 116 and width 118 dimensions may vary according to the particular application.

FIG. 1b depicts another embodiment, wherein a substrate 100 comprises a first section 102 and a second section 104, and wherein the first and second sections 102, 104 are physically and electrically coupled to each other. In an embodiment, a plurality of communication traces 114 may couple the peripheral memory devices 108 with the first memory device 106. In an embodiment, the communication traces 114 may comprise a plurality of memory channels 114. In an embodiment the substrate 100 may comprise an interposer 100.

In an embodiment, each of the additional memory devices 108 of the first sections 102', 102", 102"', 102"" may be physically and electrically coupled to individual sides of the first memory 106 by individual pluralities of communication traces 114, 114', 114", 114"' respectively. In an embodiment, a plurality of solder balls/conductive interconnects 112 may be disposed in an outer portion of the first memory device 106, and may be physically and electrically coupled to the communication traces 114, so that the first memory device 106 and the additional memory devices 108 may be electrically and physically coupled with each other. In an embodiment, the total memory that the substrate 100 may support may comprise 4 GB (x64 QDP LPDDR4) for the first memory device 106 and an additional 4 GB (x16 4x1GB LPDDR4) for the additional memory devices 108 (for in this embodiment), for a total of 8 GB LPDDR4 support. In an embodiment, the individual first sections 102', 102", 102"', 102"" of the interposer 100 may comprise openings 110 in corner locations of each of the first sections 102', 102", 102"', 102"" 102, wherein the openings 110 may function to fix/attach the substrate 100 onto a lower substrate.

Figure 2:
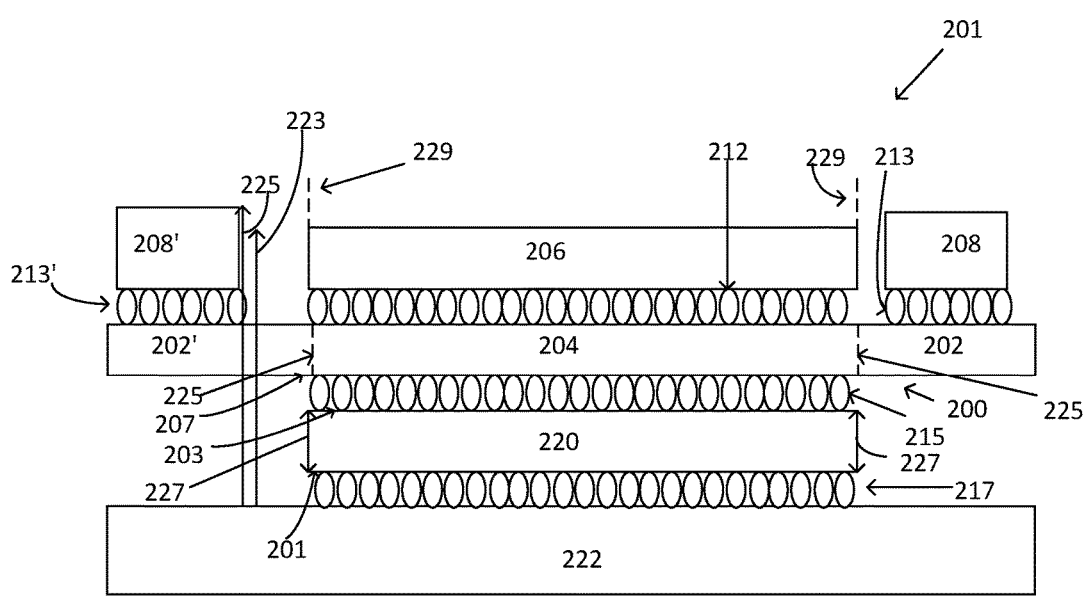
FIG. 2 represents a cross-sectional view of structures according to embodiments.

FIG. 2 depicts a cross-sectional view of a package structure 201 according to embodiments. A bottom surface 201 of a microelectronic device 220, which may comprise a system on a chip (SOC) for example, may be disposed on a board 222, such as a motherboard 222 for example. In an embodiment, the microelectronic device 220 may comprise any type of microelectronic device, such as but not limited to a microprocessor, a graphics processor, a signal processor, a network processor, a chipset, etc. In one embodiment, the device 220 comprises a SOC having multiple functional units (e.g., one or more processing units, one or more graphics units, one or more communications units, one or more signal processing units, one or more security units, etc.). However, it should be understood that the disclosed embodiments are not limited to any particular type or class of die/devices. of the device 220 may be electrically and physically coupled with the substrate/board 222 by solder balls/conductive structures 217.

Conductive connections 217 may physically and electrically couple an active side (which may comprise various circuit components such as transistors, for example) of the microelectronic device 220 to the board 222. In an embodiment, a bottom surface 207 of a substrate 200 (similar to the substrate of FIGS. 1*a*/FIG. 1*b*, for example) may be disposed on a top surface 203 of the microelectronic device 220. In an embodiment, the substrate 200, which may comprise an interposer in some embodiments, may be coupled to the top surface 203 of the device 220 by a plurality of conductive interconnects 215, such as solder conductive structures, for example.

The substrate 200 may comprise first regions 202, 202' and a second region 204. The first regions 202, 202' may comprise peripheral/terminal regions of the substrate 200, and the second region 204 may comprise a central region of the substrate 200. In an embodiment, the second region 204 of the substrate 200 may comprise a footprint 225 that is about the same dimension as a footprint 227 of the microelectronic device 220. In an embodiment, the conductive structures 215 may physically couple the second portion 204 of the substrate 200 to the top surface 203 of the microelectronic device 220, however the first portions 202, 202' of the substrate 200 may not be physically coupled to the microelectronic device 220, in an embodiment.

In an embodiment, a first memory device 206 may be disposed on a top surface of the second portion 204 of the interposer 200 and may be coupled to the second portion 204 by a plurality of conductive structures 212. In an embodiment, the first memory device 206 may comprise a footprint 229 that is about the same as a footprint 227 of the microelectronic device 220, so that the foot print 229 of the first memory device 206 is not substantially offset from the footprint 227 of the microelectronic device 220, and is substantially aligned with the microelectronic device 220. In an embodiment, the footprint 229 of the first memory device 220 may comprise an offset of within about 5% of the footprint 227 of the microelectronic device 220.

Additional memory devices 208, 208' may be disposed on the first regions 202, 202' of the substrate 200, and may be coupled to a top surface of the first regions 202, 202' by a plurality of conductive structures 213, 213' respectively. In an embodiment, the at least one additional memory devices 208 may not be disposed over the microelectronic device 220, and may be completely offset from the footprint 227 of the microelectronic device 220. In an embodiment, the additional memory devices 208, 208' may add additional Z height (the difference between the height 225 and height 223) to the package structure 201 (as opposed to the height 223 of the package 201 without the additional memory 208, 208'). In an embodiment the Z height difference may comprise about 1 mm, but may vary according to the particular application.

In another embodiment, the first memory device 206 may comprise a 4 GB memory device, and the additional memory devices 208, 208' may comprise 1 GB memory devices. In an embodiment, at least one of the first 206 or additional memory devices 208, 208' may comprise LPDDR4 RAM memory devices. The package 201 may comprise a total memory capacity of up to 8 GB of RAM in an embodiment. In an embodiment, the additional memory devices 208, 208' may comprise another set of 4×16 LPDDR4 memory devices (the substrate 201 may comprise 2 additional memory devices as shown in top views of FIG. 1*b*, for example). In an embodiment, the additional peripheral memory devices 208, 208' and the first memory device 206 may have all the memory signals multiplexed across the memory devices, except for the chip select (CS) which will enable a memory controller to select the memory device the controller requires to read or write to.

In an embodiment, an option for signal line terminations and de-caps solutions may be provided in the substrate 200 to improve the signal quality and power integrity performance if required. Thus modularization of the memory layout design is enabled, which can be re-used for multiple design skews, saving design and validation time. In an embodiment, the smaller additional memory devices 208, 208' may be located/attached along the peripheral boundaries of the substrate 200 and the larger first memory device 206 can be soldered onto the substrate 200, wherein the first memory device 206 may be substantially aligned with the microelectronic device 220 below. In an embodiment, only one set of memory (either the first memory device 206 or the additional memory devices 208, 208') may be accessed at a time, so that power delivery requirements may remain about the same (as if only the first memory device was utilized). Additionally, instantaneous power requirements may remain almost the same as if the package 201 utilized the first memory device alone.

In an embodiment, the package structure 201 may comprise a portion of a PoP assembly 201. The PoP assembly 201 may include a lower IC package 220 (comprising the microelectronic device 220) and an upper IC packages 206, 208, 208'. According to one embodiment, lower IC package 220 includes one or more processing systems and upper IC packages 206, 208, 208' include one or more memory devices. In another embodiment, lower IC package 220 includes one or more processing systems and upper IC packages 206, 208, 208' comprises portions of a wireless communications system (or, alternatively, includes one or more components of a communications system). In a further embodiment, lower IC package 220 includes one or more processing systems and upper IC package 206, 208, 208' comprise portions of a graphics processing system. The PoP assembly 201 may comprise part of any type of computing system, such as a hand-held computing system (e.g., a cell phone, smart phone, music player, etc.), mobile computing system (e.g., a laptop, nettop, tablet, etc.), a desktop computing system, or a server. In one embodiment, the PoP assembly 201 comprises a solid state drive (SSD).

Lower IC package 220 may comprise any suitable package structure. In one embodiment, the lower IC package 220 is disposed on the board 222 in a flip-chip arrangement. In another embodiment, the IC die 220 may be electrically coupled with the board 222 by one or more wire bonds.

Figure 3:
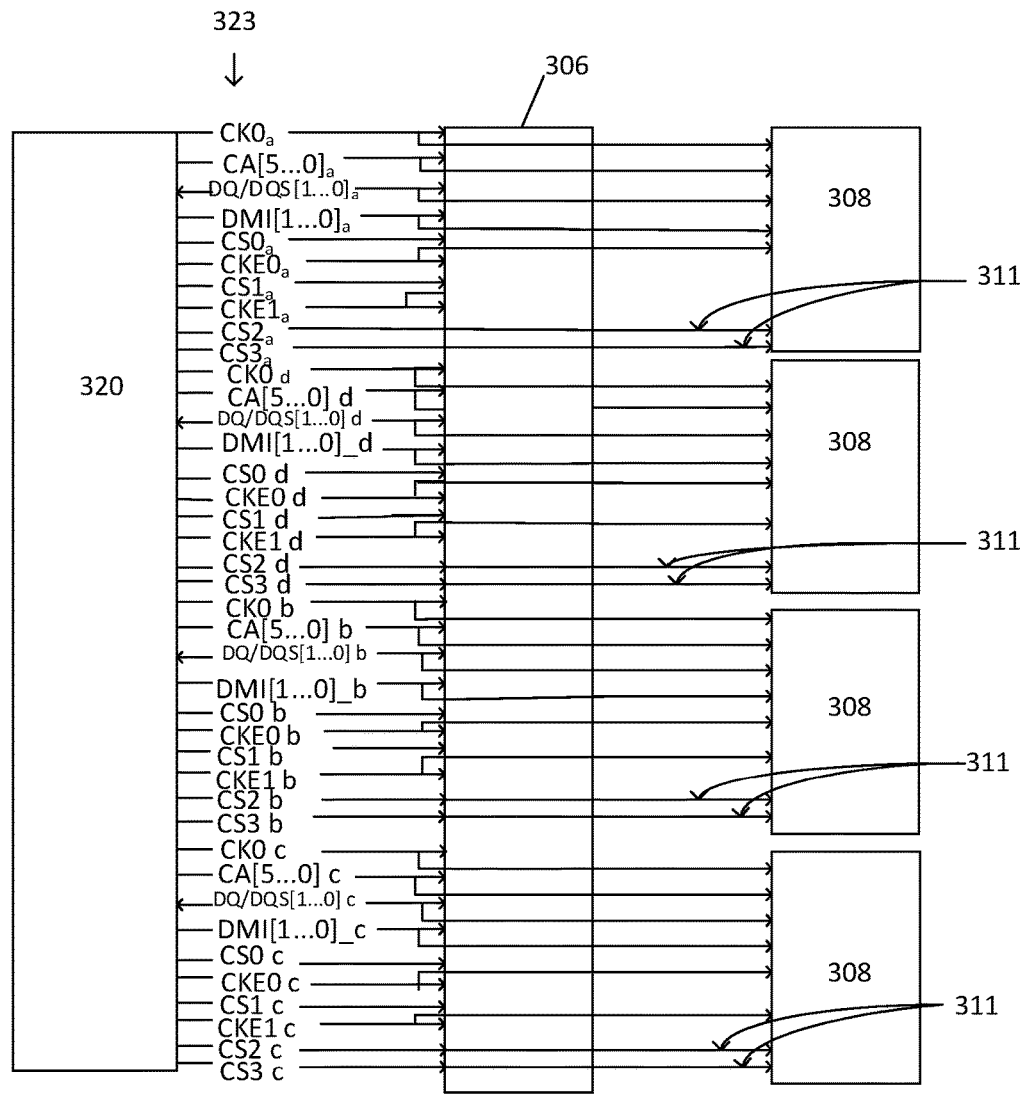
FIG. 3 represents a schematic of structures according to embodiments.

FIG. 3 depicts a schematic of a memory implementation according to embodiments. In an embodiment, a device 320, such as a SOC device, for example, may be communicatively coupled to a first memory device 306, such as a QDP, for example. In an embodiment, control signals 323 may be communicated between the device 320, and the memory devices 306 and 308. In an embodiment, the control signals may comprise such signals as CK0(Clock), CA[5 . . . 0](Command and Address)a, DQ/ DQS[1 . . . 0](Data/Strobe)a, DMI[1 . . . 0](Data Mask Inversion)a, CS(Chip Select) 0a, CKE0(Clock Enable)a, CS(Chip Select)1a, CKE (Clock Enable)1a, CS(Chip Select)2a, CS(Chip Select)3a, by illustration and not limitation. The first memory device 306 may comprise a 4 GB memory device, in an embodiment. Additional memory devices 308 (four are shown) may be coupled to the first memory device 306. In an embodiment, four additional memory devices 308 may each be physically and electrically coupled to the first memory device 306 and to the device 320. Each of the first memory device and the additional memory devices 308 may comprise LPDDR4 memory devices, in an embodiment. The first memory device 306 and the additional memory devices 308 may be disposed on a substrate 300 (not shown, but similar to the substrate 200 of FIG. 2), wherein the first memory device is aligned with (shares a footprint with) the device 320.

In an embodiment, for the LPDDR4 memory devices, each channel supports×16 data mask (DQ) lines. Each channel has its own clock, control, and command bus as well. In an embodiment, eight additional chip select command signals (CS#) 311 may be added onto the device 320, which may be added by using not connected (NC) pins that may be available pinouts on the device 320, so that the device 320 may comprise a total of 16 chip selects. In an embodiment, the device 320 may commonly comprise eight CS# signals, which can support up to 8 independent×16 channels, which will in turn support 4 GB, and may be dedicated to the first memory device 306, in an embodiment. In an embodiment, the device/microelectronic die 320 may comprise 8 chip signals dedicated to the first memory device 306, and may comprise an 8 additional chip select signals 311, wherein the 8 additional chip select signals comprise 4 sets of 2 chip select signals 311, wherein the 2 chip select signals may be routed to each of the individual additional memory devices 308. By adding up to 8 additional CS# signals to the device 320, 4 GB of additional memory capacity is added, so that the total memory support comprises 8 GB maximum.

Figure 4:
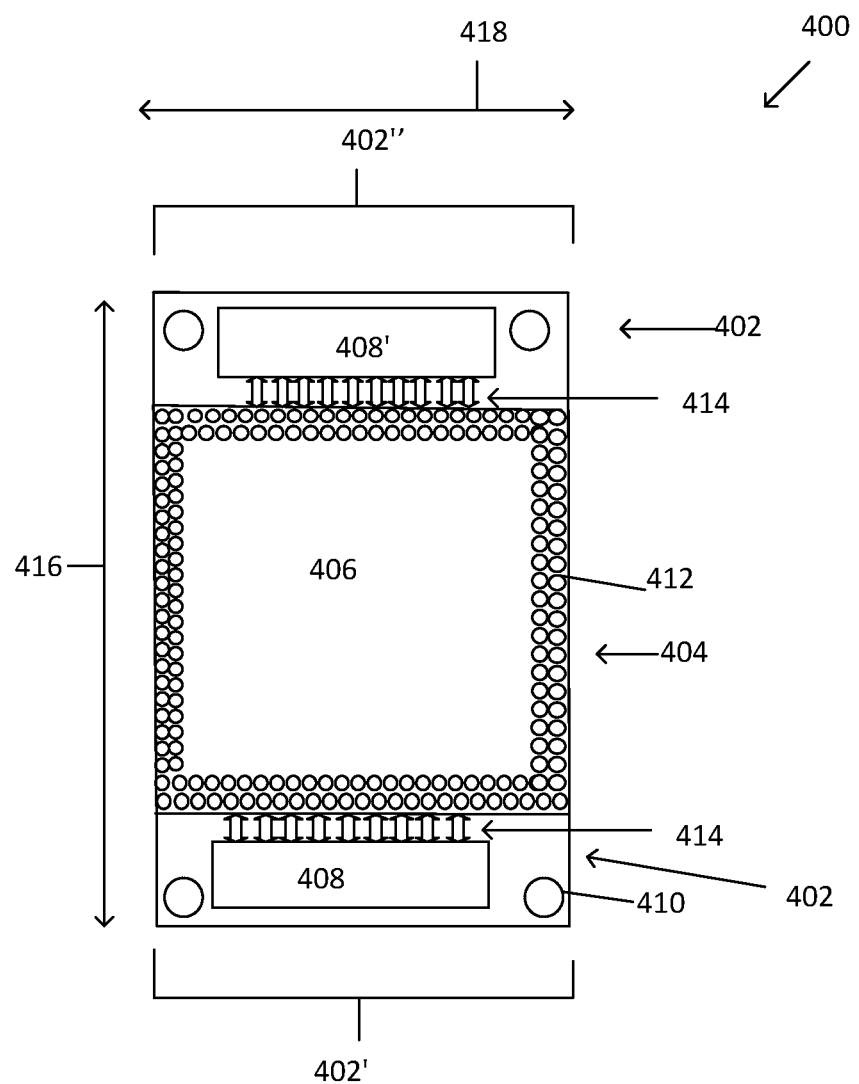
FIG. 4 represents a top view of structures according to embodiments.

FIG. 4 depicts a top view of another embodiment of a substrate 400 configuration, wherein a first region 402 of the substrate 400 comprises only two peripheral regions 402', 402". In an embodiment, the first/peripheral region may comprise two separate regions 402', 402' located on opposite sides of each other. Two additional memory devices 408, 408' may be disposed on the peripheral first regions 402', 402" of the substrate 400, and a first memory device 406 may be disposed on a second region 404, wherein the first memory device comprises 4 GB RAM. The additional memory devices 402', 402" may comprise 1 GB RAM each, for a total memory capacity of 6 GB RAM for the substrate 400, in an embodiment. This substrate 400 configuration can be utilized in embodiments wherein an underlying device, such as device 220 of FIG. 2, supports only 4×16 channels.

In an embodiment, memory traces/communication paths 414 electrically and physically couple the additional memory devices 408, 408' with the first memory device 406, through the plurality of conductive interconnect structures 402. In an embodiment, the plurality of conductive interconnect structures 412 may comprise a ball grid array comprising solder materials, for example. Openings 410 are disposed in corner locations of the first regions 402, 402' of the substrate 400, and serve to enable the attaching of the substrate 400 to a board, such as a mother board, for example. Dimensions of the substrate 400, such as length 416 and width 418 may comprise a rectangular structure in some embodiments, and may comprise about 15 mm in width 418 by about 32 mm in length 416, an embodiment, however in other embodiments, the particular dimensions of the substrate 400 may vary according to the applications.

The various embodiments of the package assemblies/structures described herein enable the fabrication of higher capacity memory for various applications, such as for mobile applications, for example in smart phones and other hand held devices. The embodiments herein increase memory support for LPDDR4 memory without a huge impact on system optimization and guidelines. The ability to double the memory supports 8 GB RAM capacity in any POP based SOC design. The embodiments herein allow for flexibility in memory device configuration, which can be used in overall memory capacity. The embodiments herein require minimum change to a particular design, and can enable design of a form factor based on a POP package with LPDDR4 RAM capacity of 8 GB.

Signal integrity is minimally impacted for the embodiments herein. Since most of the routing is restricted in the substrate, which may comprise a 6 layer PCB in embodiments, a signal length max of about 250 mils may be realized. Such a signal length will not have a major SI(Signal Integrity) impact up to speed bins of 2400 MT/s. The embodiments enable product design with LPDDR4 greater than 4 GB with a POP silicon package. Innovative memory topology is enabled, and memory layout can be modularized and re-used for any design skews, saving design and cost.

Figure 5:
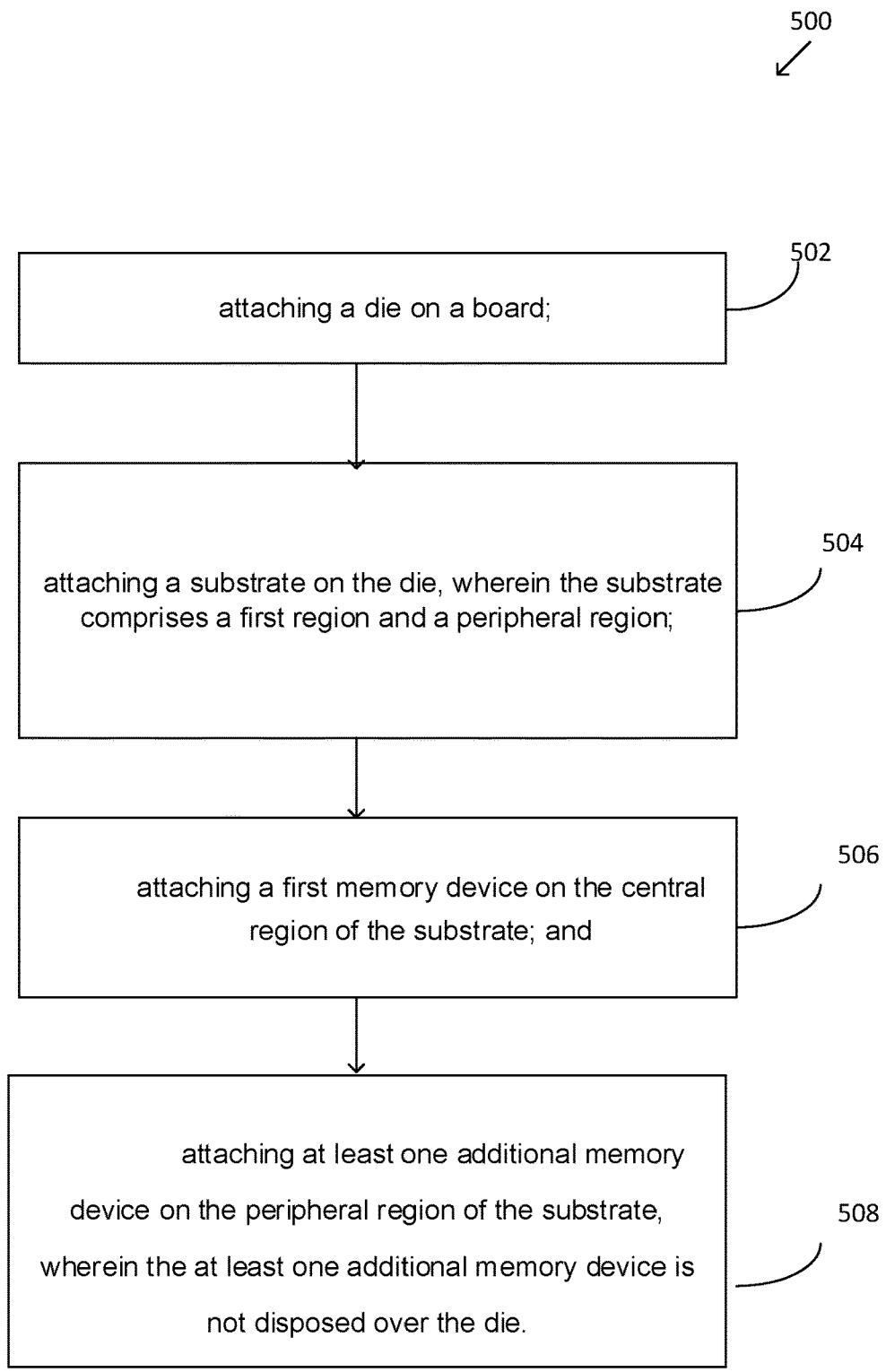
FIG. 5 represents a flow chart of a method according to embodiments.

FIG. 5 depicts a method 500 of forming a package structure according to embodiments herein. At step 502, may a die may be attached on a board. In an embodiment, the die may comprise a SOC, for example, and the board may comprise a motherboard. At step 504, a substrate may be attached on the die, wherein the substrate comprises a first region and a peripheral region. The first region may comprise separate regions separated by a gap, in an embodiment and may comprise four separate peripheral regions in one example, or may comprise two separate peripheral regions, in another example. The second region of the substrate may comprise a central region.

At step 506, a first memory device may be attached on the central region of the substrate. In an embodiment, the first memory device may comprise a footprint that is substantially the same as a footprint of the die. At step 508, at least one additional memory device may be attached on the peripheral region(s) of the substrate, wherein the at least one additional memory device is not disposed over the die. The package structure may comprise greater than 4 GB LPDDR4 RAM disposed on the substrate, and may comprise 6 GB or 8 GB LPDDR4 RAM on the substrate/interposer, in embodiments. The die may comprise up to 16 memory channels with which to communicate with the memory devices disposed on the substrate.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 6:
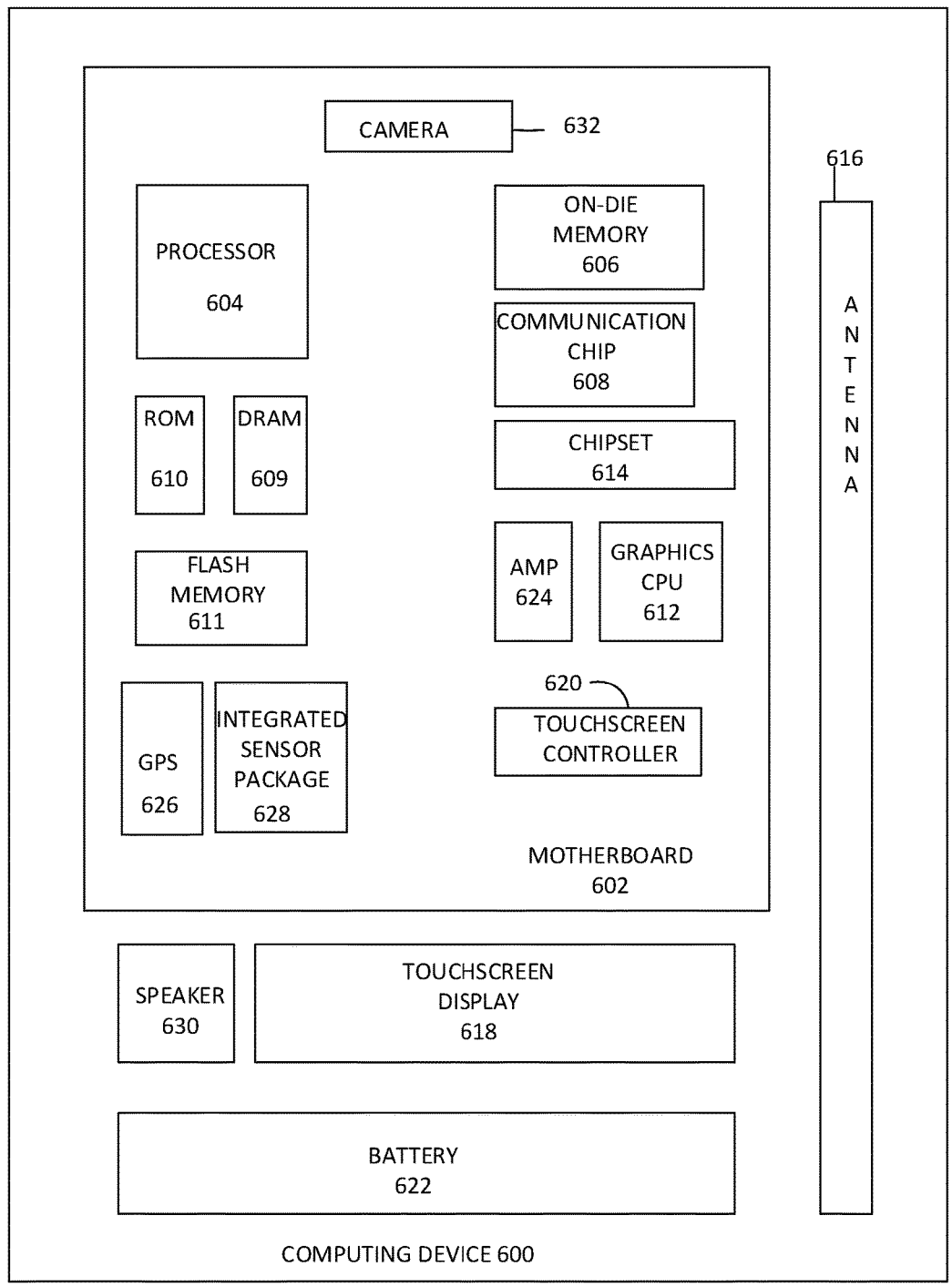
FIG. 6 represents a schematic of a computing device according to embodiments.

FIG. 6 is a schematic of a computing device 600 that may be implemented incorporating embodiments of the package structures described herein. For example, any suitable ones of the components of the computing device 600 may include, or be included in, a package structure, such as package structure 201 of FIG. 2, for example, in accordance with any of the embodiments disclosed herein. In an embodiment, the computing device 600 houses a board 602, such as a motherboard 602 for example. The board 602 may include a number of components, including but not limited to a processor 604, an on-die memory 606, and at least one communication chip 608. The processor 604 may be physically and electrically coupled to the board 602. In some implementations the at least one communication chip 608 may be physically and electrically coupled to the board 602. In further implementations, the communication chip 608 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 609, non-volatile memory (e.g., ROM) 610, flash memory 611, a graphics processor unit (GPU) 612, a chipset 614, an antenna 616, a display 618 such as a touchscreen display, a touchscreen controller 620, a battery 622, an audio codec (not shown), a video codec (not shown), a global positioning system (GPS) device 626, a speaker 630, a camera 632, compact disk (CD) (not shown), digital versatile disk (DVD) (not shown), and so forth). These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising: a board, a microelectronic device on the board, a substrate on the microelectronic device, wherein the substrate comprises a first region and a second region, wherein the first region is located in a peripheral region of the substrate and the second region is located in a central portion of the substrate, a first memory device on the second region of the substrate, and at least one additional memory device on the first region of the substrate, wherein the at least one additional memory device is not disposed over the microelectronic device.

Example 2 includes the microelectronic package structure of example 1 wherein the first memory device comprises a 4 GB memory device.

Example 3 includes the microelectronic package structure of example 2 wherein the first region comprises four separate regions each separated by a gap.

Example 4 includes the microelectronic package structure of example 3 wherein each of the four separate regions comprises a 1 GB memory device.

Example 5 includes the microelectronic package structure of example 1 wherein at least one of the first or additional memory devices comprise a LPDDR4 memory device.

Example 6 includes the microelectronic package structure of example 1 wherein a footprint of the first memory device is not substantially offset from a footprint of the microelectronic device.

Example 7 includes the microelectronic package structure of example 1 wherein the package structure comprises a package on package structure comprising 8 GB of LPDDR4 memory.

Example 8 includes the microelectronic package structure of example 1 wherein the microelectronic device comprises 16 chip select command signals.

Example 9 is a microelectronic package structure comprising a board, a microelectronic die on the board, wherein the microelectronic die comprises 16 chip select signals, and an interposer on the microelectronic die comprising a central region and a peripheral region, wherein a first memory device is on a top surface of the central region, and wherein the peripheral region comprises at least one additional memory device, and wherein the at least one additional memory device is not disposed over the microelectronic die.

Example 10 includes the microelectronic package structure of example 9 wherein the peripheral region comprises four separate regions each separated by a gap.

Example 11 includes the microelectronic package structure of example 10. wherein a 1 GB memory device is disposed on each of the four separate regions.

Example 12 includes the microelectronic package structure of example 11 wherein the microelectronic die comprises 8 chip signals dedicated to the first memory device, and 8 additional chip select signals, wherein the 8 additional chip select signals comprise 4 sets of 2 chip select signals, wherein 2 chip select signals are routed to each of the 1 GB memory devices.

Example 13 includes the microelectronic package structure of example 9 wherein the peripheral region comprises two separate regions located on opposite sides of each other.

Example 14 includes the microelectronic package structure of example 13 wherein a 1 GB memory device is disposed on a top surface of each of the two separate regions.

Example 15 includes the microelectronic package structure of example 14 wherein the interposer comprises 6 GB of LPDDR4 memory disposed thereon.

Example 16 includes the microelectronic package structure of example 9 wherein the interposer comprises 8 GB of LPDDR4 memory disposed thereon.

Example 17 is a method of forming a microelectronic package structure, comprising: attaching a die on a board, attaching a substrate on the die, wherein the substrate comprises a first region and a peripheral region, attaching a first memory device on the central region of the substrate, and attaching at least one additional memory device on the peripheral region of the substrate, wherein the at least one additional memory device is not disposed over the die.

Example 18 includes the method of forming the microelectronic package structure of example 17 wherein the die comprises 16 chip select command signals, wherein a first set of 8 chip select signals is dedicated to the die, and a second set of 8 chip select signals is routed to the at least one additional memory device.

Example 19 includes the method of forming the microelectronic package structure of example 17 wherein a footprint of the first memory device is not substantially offset from a footprint of the die.

Example 20 includes the method of forming the microelectronic package structure of example 17 wherein the first region of the substrate comprises four separate rectangular regions, separated from each other by a gap.

Example 21 includes the method of forming the microelectronic package structure of example 20 further comprising wherein a 1 GB memory device is placed in each of the four separate rectangular regions.

Example 22 includes the method of forming the microelectronic package structure of example 17 wherein the die comprises a SOC, and the first memory device comprises a 4 GB memory device.

Example 23 includes the method of forming the microelectronic package structure of example 17 further comprising wherein the microelectronic package structure comprises a PoP package, comprising a total of 8 GB LPDDR4 RAM.

Example 24 includes the method of forming the microelectronic package structure of example 17 wherein the microelectronic package comprises greater than 4 GB of memory.

Example 25 includes the method of forming the microelectronic package structure of example 17 wherein the microelectronic package structure comprises a portion of a mobile device.

Example 26 includes the microelectronic package structure of example 9 wherein the first memory device is disposed over the microelectronic die.

Example 27 includes the microelectronic package structure of claim 9 further comprising a system comprising: a communication chip communicatively coupled to the microelectronic structure; and a DRAM communicatively coupled to the communication chip.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a microelectronic package structure, comprising:
   attaching a substrate on a die, wherein the substrate comprises a central region and a peripheral region, wherein the peripheral region comprises four separate non-contiguous portions;
   attaching a memory device on the central region of the substrate, wherein a footprint of the memory device is in alignment with a footprint of the die; and
   attaching no more than one additional memory device on each of the four separate non-contiguous portions of the peripheral region of the substrate, wherein the additional memory device is not over the die.

2. The method of claim 1 wherein the die comprises 16 chip select command signals, wherein a first set of 8 chip select signals is dedicated to the die, and a second set of 8 chip select signals is routed to at least one additional memory device.

3. The method of claim 1 wherein the four separate non-contiguous portions comprise rectangular regions, and are separated from each other by a gap, wherein the gap is a region free of the substrate material.

4. The method of claim 1 further comprising wherein the microelectronic package structure comprises a PoP package, comprising a total of 8 GB LPDDR4 RAM.

5. The method of claim 3 further comprising wherein no more than 1 GB memory device is placed on each of the four separate non-contiguous rectangular regions.

6. The method of claim 1 wherein the footprint of the memory device is substantially the same as the footprint of the die.

7. The method of claim 1 wherein the die comprises a system on a chip, and the memory device comprises a 4 GB memory device.

8. The method of claim 1 wherein the microelectronic package structure comprises a portion of a mobile device.

9. The method of claim 1 wherein the microelectronic package comprises greater than 4GB of memory.

10. A microelectronic package structure comprising:
a substrate;
a microelectronic device on the substrate;
a first region of the substrate, wherein the first region is located in a peripheral region of the substrate, and wherein the first region comprises four separate non-contiguous portions;
a second region of the substrate, wherein the second region is located in a central portion of the substrate;
a memory device on the second region of the substrate, wherein a footprint of the memory device is in alignment with a footprint of the microelectronic device; and
no more than one additional memory device on each of the four separate non-contiguous portions of the first region of the substrate, wherein the no more than one additional memory device is not over the microelectronic device.

11. The microelectronic package structure of claim 10 wherein at least one of the memory device on the central portion of the substrate or the additional memory devices on each of the four separate non-contiguous portions of the peripheral region of the substrate comprise a LPDDR4 memory device.

12. The microelectronic package structure of claim 10 wherein the microelectronic device comprises 16 chip select command signals, and wherein the microelectronic device is on a board.

13. The microelectronic package structure of claim 10 wherein the footprint of the memory device is substantially the same as the footprint of the microelectronic device.

14. The microelectronic package structure of claim 10 wherein the package structure comprises a package on package structure comprising 8 GB of LPDDR4 memory.

15. The microelectronic package structure of claim 10 wherein the memory device comprises a 4 GB memory device.

16. The microelectronic package structure of claim 15 wherein the four separate non-contiguous portions are separated from each other by a gap, wherein the gap is a region free of the substrate material.

17. The microelectronic package structure of claim 16 wherein each of the four separate non-contiguous portions comprise a 1GB memory device.

* * * * *